United States Patent [19]

Babcock

[11] Patent Number: 4,633,146

[45] Date of Patent: Dec. 30, 1986

[54] DRIVE CIRCUIT FOR MULTIPLE SCAN RATE HORIZONTAL DEFLECTION CIRCUIT

[75] Inventor: William E. Babcock, Warren, N.J.

[73] Assignee: RCA Corporation, Princeton, N.J.

[21] Appl. No.: 524,143

[22] Filed: Jun. 9, 1983

[51] Int. Cl.[4] ..................... H01J 29/70; H01J 29/76
[52] U.S. Cl. ..................... 315/395; 315/408
[58] Field of Search ............ 315/395, 396, 397, 408; 358/137, 216

[56] References Cited

U.S. PATENT DOCUMENTS

| | | | |
|---|---|---|---|
| 3,491,200 | 1/1970 | Wisnieff | 315/395 |
| 3,628,083 | 12/1971 | Holmes et al. | 315/397 |
| 3,857,059 | 12/1974 | Larson | 315/395 |
| 3,887,842 | 6/1975 | Owens, Jr. et al. | 315/397 |
| 3,965,390 | 6/1976 | Spencer, Jr. | 315/397 |
| 4,177,393 | 12/1979 | Förster | 307/270 |
| 4,241,296 | 12/1980 | Barter | 315/397 |
| 4,323,826 | 4/1982 | Lehman | 315/408 |
| 4,353,013 | 10/1982 | Lehman | 315/387 |
| 4,400,653 | 8/1983 | Olmstead | 315/408 |

OTHER PUBLICATIONS

Tektronix 690SR Television Color Monitor Instruction Manual, pp. 5-16 to 5-22 and Horizontal Deflection Schematic Diagram.

*Primary Examiner*—Theodore M. Blum
*Assistant Examiner*—Gregory C. Issing
*Attorney, Agent, or Firm*—Paul J. Rasmussen; Joseph Laks; Scott J. Stevens

[57] ABSTRACT

A drive circuit for a horizontal deflection circuit that is operable at a number of horizontal scan rates includes a pair of transistors coupled in a push-pull arrangement. The voltage supplies for the drive circuit transistors, which provide the forward and reverse drive for the horizontal output transistor, produce voltage levels that are dependent upon the horizontal scanning rate that is selected in order to minimize power dissipation during switching of the horizontal output transistor.

5 Claims, 5 Drawing Figures

DRIVE CIRCUIT FOR MULTIPLE SCAN RATE HORIZONTAL DEFLECTION CIRCUIT

This invention relates to horizontal deflection circuits and in particular to horizontal deflection circuits having multiple scan rates.

In recent years, the quality of the picture displayed by commercial television receivers has been greatly improved. Computer monitors or word processing display terminals, however, may require even greater resolution and sharpness than is currently possible with ordinary receivers. Further improvements in picture quality may be obtained through improvements in color picture tubes and signal processing, and through modification of current signal processing standards. Modification of signal processing standards should, however, be compatible with the circuitry in receivers already in use and should not make them obsolete.

A technique which improves the observed picture quality provides a change in the horizontal scanning system from the current line interlaced to a non-interlaced, or progressive scan system. This would involve an increase in the horizontal scanning rate from 15.75 KHz to 31.5 KHz, or 63 KHz, but would not require any change in the transmitted signal. Therefore, there would be no effect on reproduction of pictures by receivers already in use. Benefits of the non-interlaced scanning system for monitors and video display terminals would be the almost complete elimination of such picture artifacts as large area flicker, inter-line flicker, line breakup and line crawl.

At high scanning or deflection rates, such as 31.5 KHz and 63 KHz, power dissipation in the horizontal output transistor is considerably higher than at a normal receiver scanning rate of 15.75 KHz. Proper adjustment of the horizontal drive waveform is necessary in order to minimize this power dissipation. The negative portion of the drive waveform is extremely critical, as that represents the interval when stored charge in the output transistor is removed as the transistor is being turned off. In a conventional television receiver, the negative drive that sweeps out the stored charge is provided by a secondary winding of a horizontal driver transformer. Leakage inductance of the transformer and external components are used to shape the drive waveform as desired.

At high scanning rates, the leakage inductance of the driver transformer may not be low enough to provide the required amount of negative drive to the horizontal output transistor in order to remove the stored charge. Also, at high scanning rates, it is desirable to remove the stored charge at a faster rate in order to maintain a desirable trace interval to retrace interval ratio. It is also desirable to provide a means for switching between scanning rates to provide additional versatility in the use of video display equipment.

In accordance with an aspect of the present invention, a horizontal deflection circuit operable at first and second horizontal scan rates comprises a circuit that provides a drive signal having first signal levels in response to the selection of the first scan rate and second signal levels in response to the selection of the second scan rate. Circuitry responds to the drive signal and produces horizontal deflection signals.

In the accompanying drawing.

Figure 1:
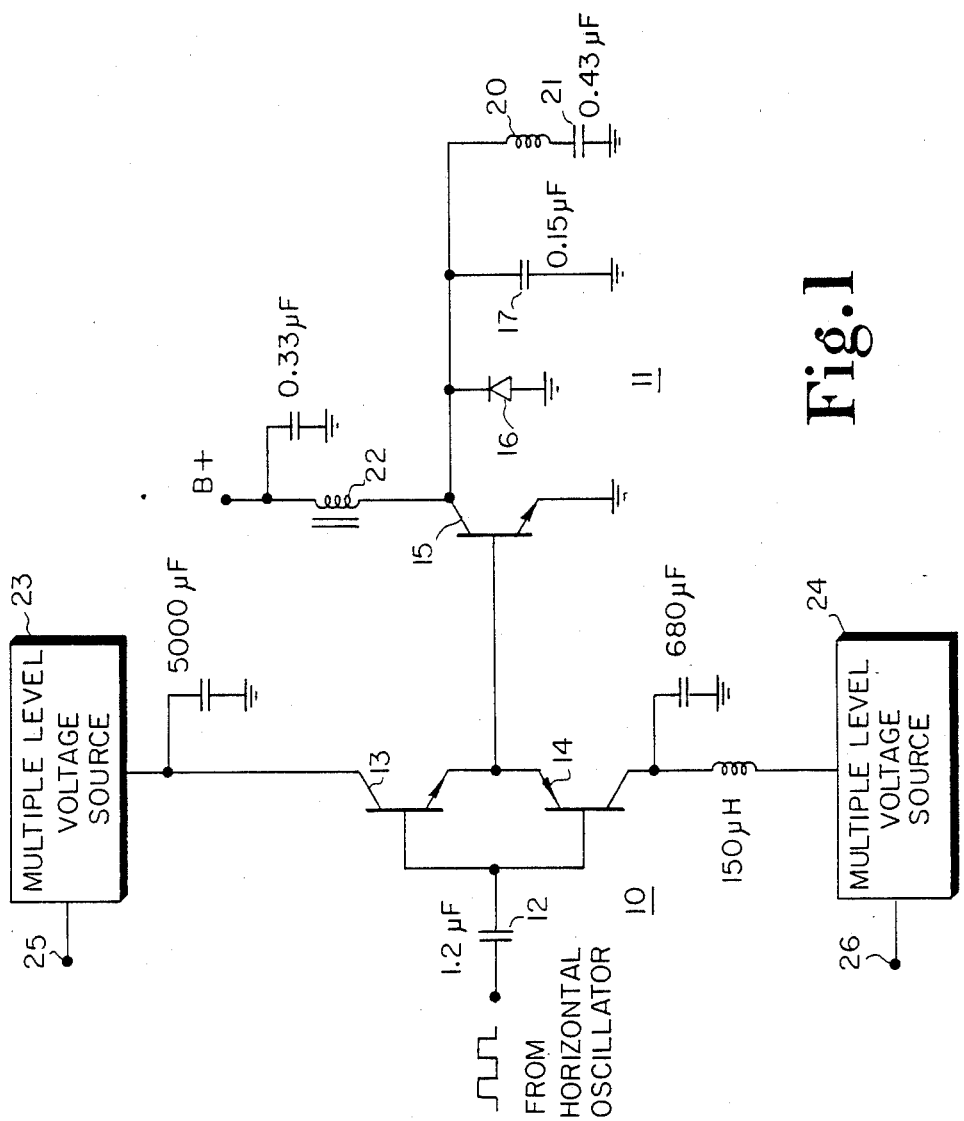
FIG. 1 is a schematic and block diagram of a horizontal deflection circuit incorporating a drive circuit in accordance with an aspect of the present invention.

Referring to FIG. 1, there is shown a horizontal drive circuit 10 and a horizontal output circuit 11.

A horizontal rate signal having a selected frequency (based on the selected horizontal scan or deflection rate) is applied to drive circuit 10 from a horizontal oscillator (not shown). The signal from the horizontal oscillator is applied through a coupling capacitor 12 to the bases of transistors 13 and 14, connected in a push-pull arrangement. The emitters of transistors 13 and 14 are connected together and provide a drive signal to the base of the horizontal output transistor 15 of horizontal output circuit 11 without the need for a driver transformer. Horizontal output circuit 11 also includes a damper diode 16, retrace capacitor 17, horizontal deflection coils 20 and S-shaping capacitor 21. Power is provided to output circuit 11 from a source of voltage B+ via a winding 22 of a high voltage transformer (not shown). The drive signals from drive circuit 10 switch transitor 15 between conductive and nonconductive states at the desired horizontal scan or deflection frequency. Retrace pulses appearing across retrace capacitor 17 and winding 22 when transistor 15 is switched off are commonly used via the high voltage transformer to generate the high voltage that is applied to the anode of a picture tube (not shown).

Figure 2A:
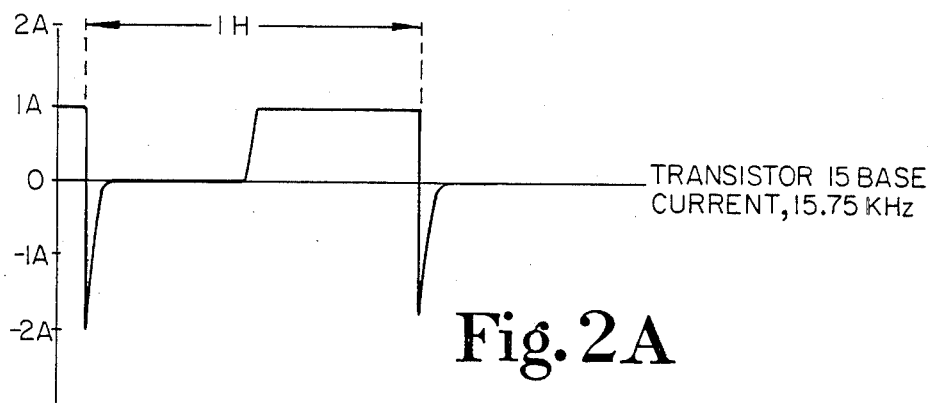
FIG. 2 illustrates waveforms associated with the drive circuit sown in FIG. 1.
Figure 2B:
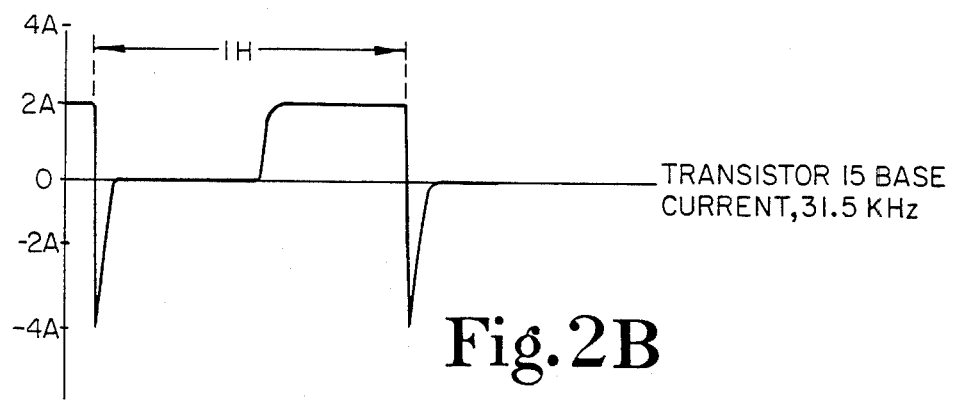
Figure 2C:
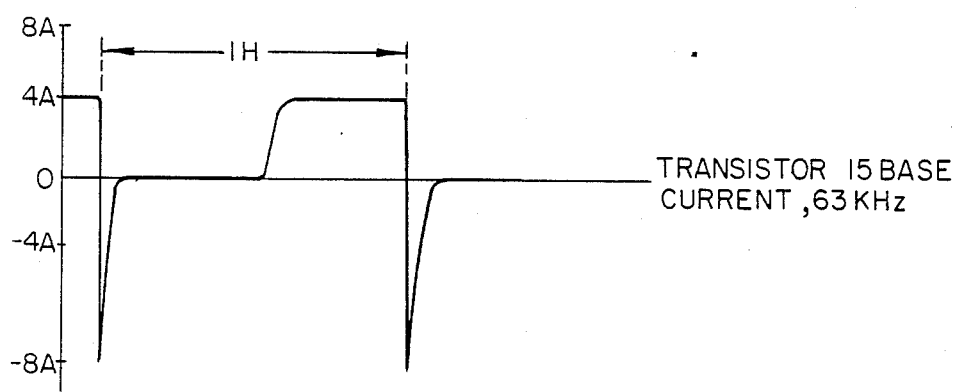

As previously described, it is important to remove the charge stored in the base region of transistor 15 as rapidly as possible when transistor 15 is switched off from its saturated conduction state in order to reduce the power dissipation of transistor 15 as much as possible. In accordance with an aspect of the present invention, drive circuit 10 incorporates multiple level voltage sources 23 and 24 which are coupled to the collectors of transistors 13 and 14, respectively. Multiple level voltage source 23 provides a positive voltage which determines the forward drive level for transistor 15. The magnitude or level of the voltage provided by voltage source 23 is dependent on the horizontal scanning or deflection rate that is selected. For example, to maintain a constant trace to retrace interval ratio, the inductance of the horizontal deflection coils 20 is decreased as the horizontal scanning frequency increases. This causes the forward drive current requirement of transistor 15 to increase in order to maintain a given deflection current, which in turn requires a higher voltage requirement from voltage source 23. This is illustratively shown in FIGS. 2A, 2B and 2C, which shows the base or drive current waveforms of horizontal output transistor 15 at horizontal scanning rates of 15.75 KHz, 31.5 KHz and 63 KHz, respectively. The output of voltage source 23, as shown in FIG. 1, is controlled by a signal at a terminal 25. This signal is representative of the scanning rate selected.

Multiple level voltage source 24 provides a negative voltage level to the collector of transistor 14 which determines the negative drive level for transistor 15. As the horizontal scanning frequency is increased, the negative drive current requirement, and hence the magnitude of the voltage level of the voltage source 24 is increased, as shown illustratively by the base current waveforms of FIGS. 2A, 2B and 2C. The voltage level provided by voltage source 24 as shown, is controlled by a signal at terminal 26. This signal is also representative of the selected horizontal scan rate.

It is possible to maintain a constant retrace interval by maintaining constant inductance deflection coils at different frequencies. Although the horizontal output circuit voltage supply requirements may change, the forward drive level for the horizontal output transistor would remain constant. A multiple level supply, such as voltage source 23, would not be necessary in this case. However, the negative drive requirement would change as the scanning frequency changed. Therefore, a multiple level supply, such as voltage source 24, would be needed.

The operation of a multiple scan rate deflection circuit is described in detail in U.S. patent application Ser. No. 497,950, filed May 25, 1983, in the names of W. F. Wedam, et al., entitled "POWER SUPPLY AND DEFLECTION CIRCUIT PROVIDING MULTIPLE SCAN RATES", and is hereby incorporated by reference. Patent application Ser. No. 497,950 describes an illustrative arrangement for producing a signal representative of the horizontal scanning rate selected, which could be applied, for example, to terminals 25 and 26 of FIG. 1. Patent application Ser. No. 497,950 also describes arrangements for changing the S-shaping capacitance and the horizontal output circuit supply voltage when the horizontal scanning frequency is changed. Multiple level voltage sources 23 and 24 could include, for example, some form of switching circuitry which would control the magnitude of the voltage levels produced by voltage sources 23 and 24.

Figure 3:
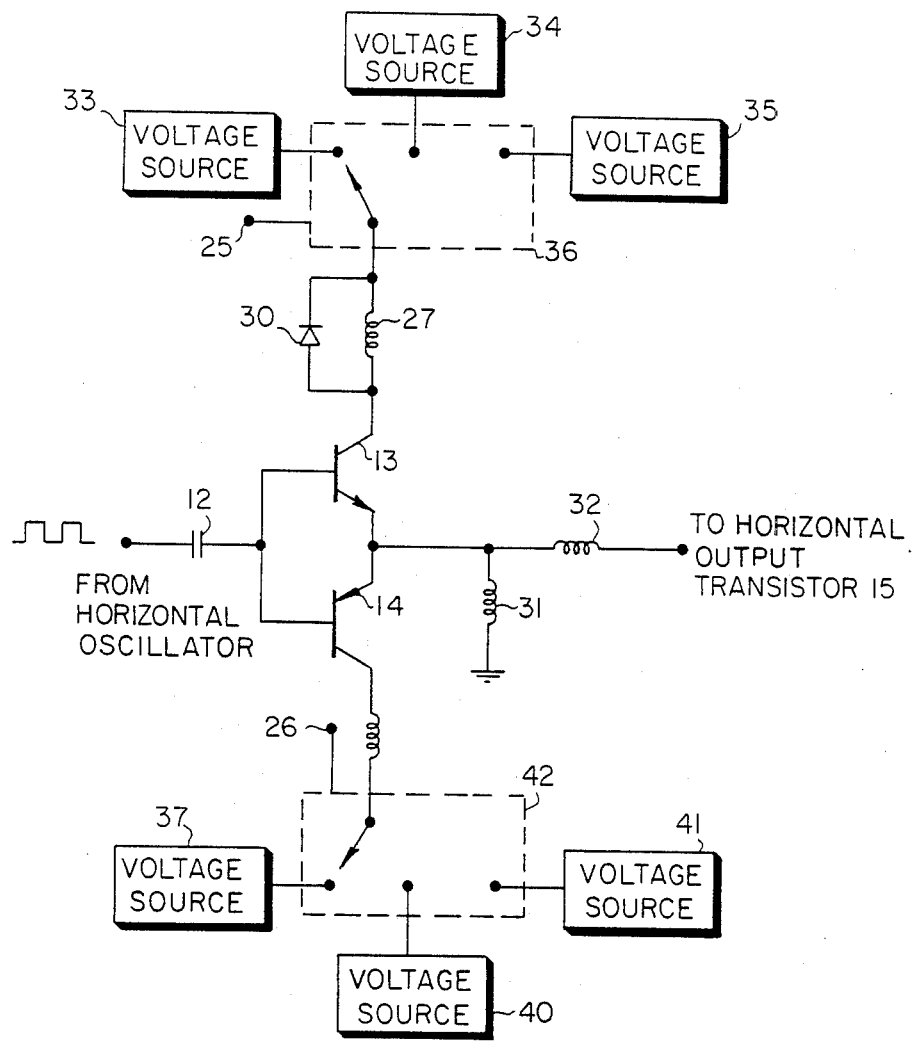
FIG. 3 is a schematic and block diagram of a portion of the circuit sown in FIG. 1, illustrating additional features.

FIG. 3 shows a drive circuit similar to that shown in FIG. 1 which includes components that further aid in shaping of the drive waveform for the horizontal output transistor.

Inductor 27 provides shaping of the collector current for transistor 13. Diode 30 returns some power to the voltage source during the negative drive interval. Shaping of the base current waveform for the horizontal output transistor is also provided by inductors 31 and 32.

The source of voltage for transistor 13, which provides the forward drive to horizontal output transistor 15 is shown as separate voltage sources 33, 34 and 35, which illustratively provide voltage levels for operation at horizontal scanning rates of 15.75 KHz, 31.5 KHz and 63 KHz, respectively. Additional voltage sources for additional scanning frequencies are of course possible. A switching circuit 36, schematically shown, selects the appropriate voltage source based on the selected scanning rate representative signal at terminal 25.

The source of voltage for transistor 14, which provides negative or reverse drive for transistor 15, is shown as individual voltage sources 37, 40 and 41 which provide voltage levels for operation at horizontal scanning rates of 15.75 KHz, 31.5 KHz and 63 KHz, respectively. A switching circuit 42, similar to switching circuit 36, selects the proper voltage sources in response to the signal at terminal 26.

What is claimed is:

1. A resonant retrace horizontal deflection circuit operable at first and second selectable horizontal scan rates comprising:
    means providing a drive signal having a first signal amplitude in response to the selection of said first selectable horizontal scan rate and having a second signal amplitude in response to the selection of said second selectable horizontal scan rate; and
    output means incorporating a deflection winding and a switching transistor having a base terminal coupled to said drive signal providing means, said switching transistor responsive to said drive signal for causing switching of said switching transistor between saturated and nonconductive states in order to provide horizontal deflection current in said deflection winding defining trace and retrace intervals, said first and second signal amplitudes determining the length of the transition interval when said switch transistor switches between said saturated and said nonconductive states.

2. A resonant retrace horizontal deflection circuit operable at multiple horizontal scan rates comprising:
    means for providing first horizontal rate signals at a plurality of selectable frequencies;
    a drive circuit having a first terminal coupled to said means for providing first horizontal rate signals, a second terminal providing horizontal rate drive signals at a frequency dependent upon the frequency of said first horizontal rate signals, and a third terminal;
    a horizontal output circuit incorporating a deflection winding and a switching transistor having a base terminal coupled to said drive circuit second terminal, said switching transistor responsive to said drive signals for causing switching of said switching transistor between saturated and nonconductive states in order to provide horizontal trace and retrace current in said deflection winding, said transition interval between said saturated and nonconductive states of said switching transistor being determined by the amplitude of said drive signals; and
    means coupled to said third terminal of said drive circuit for providing to said drive circuit a voltage having a level dependent upon the frequency of said first horizontal rate signals, the magnitude of said voltage level determining the amplitude of said drive signals.

3. The arrangement defined in claim 1, wherein said switching transistor has switching characteristics determined by said first and second signal amplitudes.

4. The arrangement defined in claim 2, wherein said voltage level magnitude determines the reverse base current amplitude of said switching transistor.

5. The arrangement defined in claim 2, wherein said means for providing a voltage comprises a DC voltage supply for generating a DC voltage having different voltage levels in response to different selected scan frequencies in order to provide different peak reverse base current amplitudes for said switching transistor.

* * * * *